United States Patent
Huang et al.

(10) Patent No.: US 10,508,342 B2
(45) Date of Patent: Dec. 17, 2019

(54) METHOD FOR MANUFACTURING DIAMOND-LIKE CARBON FILM

(71) Applicant: CREATING NANO TECHNOLOGIES, INC., Tainan (TW)

(72) Inventors: Shih-Ming Huang, Tainan (TW); Jie Huang, Tainan (TW); Wei-Hsiang Yang, Tainan (TW)

(73) Assignee: CREATING NANO TECHNOLOGIES, INC., Tainan (TW)

( * ) Notice: Subject to any disclaimer, the term of this patent is extended or adjusted under 35 U.S.C. 154(b) by 0 days.

(21) Appl. No.: 15/250,905

(22) Filed: Aug. 29, 2016

(65) Prior Publication Data
US 2018/0057941 A1 Mar. 1, 2018

(51) Int. Cl.
  *C23C 16/50* (2006.01)
  *C23C 14/06* (2006.01)
  *C23C 16/26* (2006.01)
  *C23C 14/48* (2006.01)
  *C23C 16/02* (2006.01)
  *C23C 16/46* (2006.01)

(52) U.S. Cl.
  CPC .......... *C23C 16/50* (2013.01); *C23C 16/0245* (2013.01); *C23C 16/26* (2013.01); *C23C 16/46* (2013.01)

(58) Field of Classification Search
  CPC ... C23C 16/50; C23C 14/0605; C23C 14/325; C23C 14/345; C23C 14/48; C23C 16/26
  See application file for complete search history.

(56) References Cited

U.S. PATENT DOCUMENTS

| | | | | |
|---|---|---|---|---|
| 4,434,188 A | * | 2/1984 | Kamo | C23C 16/274 204/173 |
| 5,051,785 A | * | 9/1991 | Beetz, Jr. | C30B 25/02 257/77 |
| 5,081,438 A | * | 1/1992 | Nakahata | H01C 7/041 29/612 |
| 5,370,855 A | * | 12/1994 | Gruen | C23C 14/0605 423/446 |

(Continued)

FOREIGN PATENT DOCUMENTS

CN 102260859 A 11/2011
JP H1112735 A 1/1999

(Continued)

OTHER PUBLICATIONS

Yang Yu Wei et al. "Properties, Processing and Application of Diamond-like Carbon Film", Bulletin of the Chinese Ceramic Society, vol. 27, No. 1, Feb. 2008.

*Primary Examiner* — Dah-Wei D. Yuan
*Assistant Examiner* — Kristen A Dagenais-Englehart
(74) *Attorney, Agent, or Firm* — CKC & Partners Co., LLC

(57) ABSTRACT

A method for manufacturing a diamond-like carbon film is described, which includes the following steps. A substrate is disposed into a chamber. An aromatic cyclic hydrocarbon is introduced into the chamber. A diamond-like carbon film is grown on the substrate by using the aromatic cyclic hydrocarbon as a reaction precursor The step of growing the diamond-like carbon film includes controlling a substrate temperature at 200 Celsius degrees to 800 Celsius degrees.

20 Claims, 1 Drawing Sheet disposing a substrate into a chamber ～200 introducing an aromatic cyclic hydrocarbon into the chamber ～202 growing a diamond-like carbon film ～204

(56) References Cited

U.S. PATENT DOCUMENTS

| | | | | |
|---|---|---|---|---|
| 5,387,310 A | * | 2/1995 | Shiomi | C30B 29/04 |
| | | | | 117/101 |
| 5,404,835 A | * | 4/1995 | Yoder | C30B 25/02 |
| | | | | 117/79 |
| 5,620,512 A | * | 4/1997 | Gruen | C23C 14/0605 |
| | | | | 117/108 |
| 5,891,241 A | * | 4/1999 | Yoshida | C30B 1/023 |
| | | | | 117/8 |
| 2007/0105373 A1 | * | 5/2007 | Wang | C23C 16/0272 |
| | | | | 438/680 |

FOREIGN PATENT DOCUMENTS

| | | |
|---|---|---|
| TW | 370571 | 9/1999 |
| TW | 448243 B | 8/2001 |
| TW | 585933 B | 5/2004 |
| TW | I363742 B | 5/2012 |
| TW | I372111 B | 9/2012 |
| TW | I404129 B | 8/2013 |
| WO | 0167834 A1 | 9/2001 |

\* cited by examiner

METHOD FOR MANUFACTURING
DIAMOND-LIKE CARBON FILM

BACKGROUND

Field of Invention

The present invention relates to a method for manufacturing a film. More particularly, the present invention relates to a method for manufacturing a diamond-like carbon (DLC) film.

Description of Related Art

A diamond-like carbon film is an amorphous carbon film, and includes $SP^2$ bonding and $SP^3$ bonding, in which a content of the $SP^3$ bonding is greater than that of the $SP^2$ bonding. Because the diamond-like carbon film has a higher content of the $SP^3$ bonding, the diamond-like carbon film has many properties similar to those of a diamond, such as high hardness, high Young's modulus, high electric resistivity, high thermal conductivity, a wide optical transmittance range, chemical resistant and good wear resistance. In addition, the diamond-like carbon film can be grown under a low temperature, and is obtained more easily than the diamond. Furthermore, in the application of a mold, because the diamond-like carbon film has low friction coefficient, high hardness and high flatness, the diamond-like carbon film has advantages of anti-adhesion for releasing mold easily and prolonging service life of the mold. Thus, the diamond-like carbon film has great application potential on optics, electronic, and machine fields.

The diamond-like carbon film formed under a high substrate temperature is easily graphitized, and hardness of the diamond-like carbon film is greatly reduced. Therefore, the coating of the diamond-like carbon film is typically performed under the room temperature or a low temperature (smaller than the room temperature). However, the diamond-like carbon film formed under the room temperature or the low temperature is typically degraded in air under a temperature ranging from about 350 degrees centigrade to about 400 degrees centigrade, and in nitrogen gas under a temperature ranging from about 550 degrees centigrade to about 600 degrees centigrade. Thus, for example, in the mold application, with regarding to a mold of a high temperature molding process (e.g. a process has a process temperature ranging from 700 degrees centigrade to 800 degrees centigrade), the degraded problem of the diamond-like carbon film caused by the high temperature seriously affects its applicability, and thus reducing the application of the diamond-like carbon film.

Currently, diamond-like carbon films having thermostability, which can resist a temperature ranging from about 650 degrees centigrade to 700 degrees centigrade in air, and can resist a temperature ranging from about 900 degrees centigrade to 1000 degrees centigrade in nitrogen gas, have been developed. However, in the developed diamond-like carbon films, while the thermostability of the diamond-like carbon films is increased, the hardness of the diamond-like carbon films is decreased. For example, the hardness of the typical diamond-like carbon film can be about 10 GPa to about 25 GPa, but the hardness of the newly developed diamond-like carbon film having thermostability can be only about 8 GPa to about 15 GPa. Thus, the application of the newly developed diamond-like carbon film is greatly decreased.

In addition, the diamond-like carbon film is currently grown with a lower growing temperature, such as the room temperature or a low temperature, and when the growing process needs to be integrated with another film-growing process (for example, a coating temperature of a titanium nitride (TiN) layer needs to be greater than 300 degrees centigrade for forming the titanium nitride layer having a good crystal form) which is performed under a high temperature, such that after the high temperature film-coating process is completed, the substrate temperature needs to be lowered to the room temperature firstly, and then the coating process of the diamond-like carbon film is performed. However, in the vacuum, it will take much time to lower the substrate temperature to the desired growing temperature of the diamond-like carbon film, such that it is difficult to integrate the coating process of the diamond-like carbon film and the other high temperature coating processes, and thus affecting fluency of the entire coating process.

SUMMARY

Therefore, one objective of the present invention is to provide a method for manufacturing a diamond-like carbon film, which uses an aromatic cyclic hydrocarbon as a reaction precursor for growing a diamond-like carbon film. The aromatic cyclic hydrocarbon has a benzene ring structure, such that the diamond-like carbon film including more $sp^3$ structures (diamond structures) and less $sp^2$ structures (graphite structures) can be grown under a high substrate temperature, thereby obtaining the diamond-like carbon film of high hardness and high quality.

Another objective of the present invention is to provide a method for manufacturing a diamond-like carbon film, in which an aromatic cyclic hydrocarbon used as a reaction precursor for growing a diamond-like carbon film has a high carbon-hydrogen ratio, such that a hydrogen content of the diamond-like carbon film can be effectively decreased.

Still another objective of the present invention is to provide a method for manufacturing a diamond-like carbon film, which can form a diamond-like carbon film with a low hydrogen content, such that the quantity of the hydrogen liberated from the diamond-like carbon film under a high temperature environment can be decreased, and a graphitization phenomenon of the diamond-like carbon film and the reduction of hardness of the diamond-like carbon film resulted from the graphitization of the diamond-like carbon film will not occur easily, thereby effectively solving a hardness reduction problem of the diamond-like carbon film occurring under a high temperature application environment.

Further another objective of the present invention is to provide a method for manufacturing a diamond-like carbon film, which forms a diamond-like carbon film under a high substrate temperature, such that the method can be integrated with film-coating processes, which need to be performed under a raised temperature, and thus enhancing the performance of the entire film-coating processes.

According to the aforementioned objectives, the present invention provides a method for manufacturing a diamond-like carbon film, which includes the following steps. A substrate is disposed into a chamber. An aromatic cyclic hydrocarbon is introduced into the chamber. A diamond-like carbon film is grown on the substrate by using the aromatic cyclic hydrocarbon as a reaction precursor, in which growing the diamond-like carbon film includes controlling a substrate temperature at a range from substantially 200 degrees centigrade to substantially 800 degrees centigrade.

According to an embodiment of the present invention, a chemical formula of the aromatic cyclic hydrocarbon is $C_xH_y$, in which x is greater than or equal to y.

According to an embodiment of the present invention, the aromatic cyclic hydrocarbon is a polycyclic aromatic hydrocarbon. In some examples, the polycyclic aromatic hydrocarbon may be naphthalene, phenanthrene, pyrene, fullerene phenanthroline, phenanthridine, or xanthene.

According to an embodiment of the present invention, the aromatic cyclic hydrocarbon is a monocyclic aromatic hydrocarbon. In some examples, the monocyclic aromatic hydrocarbon may be benzene or toluene.

According to an embodiment of the present invention, before growing the diamond-like carbon film, the method further includes introducing a hydrocarbon having no benzene ring into the chamber, in which with total parts by weight of the aromatic cyclic hydrocarbon and the hydrocarbon having no benzene ring being 100, a part by weight of the hydrocarbon having no benzene ring is smaller than or equal to substantially 50.

According to an embodiment of the present invention, the aromatic cyclic hydrocarbon includes nitrogen elements, oxygen elements, or sulfur elements, and with the absence of hydrogen elements of the aromatic cyclic hydrocarbon, a content of carbon elements of the aromatic cyclic hydrocarbon is equal to or greater than 80 atomic percent (at. %).

According to an embodiment of the present invention, growing the diamond-like carbon film includes adding silicon (Si), boron (B), aluminum (Al), titanium (Ti) family (group IVB) elements, vanadium (V) family (group VB) elements, chromium (Cr) family (group VIB) elements, silicon compounds, boron compounds, aluminum compounds, compounds of titanium family (group IVB) elements, compounds of vanadium family (group VB) elements, and/or compounds of chromium family (group VIB) elements.

According to an embodiment of the present invention, growing the diamond-like carbon film comprises using a physical vapor deposition (PVD) method, a plasma-enhanced chemical vapor deposition (PECVD) method, a filtered cathodic arc deposition method, an electron cyclone resonance microwave plasma method, a sputtering method, an ion plating method, or a cathodic arc deposition method.

BRIEF DESCRIPTION OF THE DRAWINGS

The embodiments and the advantages thereof can be more fully understood by reading the following detailed description of the embodiment, with reference made to the accompanying drawings as follows.

DETAILED DESCRIPTION

In view of the conventional diamond-like carbon films cannot be formed under high temperature temperatures, and the conventional diamond-like carbon films are degraded and the hardness of the conventional diamond-like carbon films is greatly decreased under a high temperature application environment, and thus seriously limiting the application of the diamond-like carbon films. Therefore, the present invention provides a method for manufacturing a diamond-like carbon film, which uses an aromatic cyclic hydrocarbon as a reaction precursor for growing a diamond-like carbon film, and can grow the diamond-like carbon film under a high substrate temperature. Due to the high carbon-hydrogen ratio and the benzene ring structure of the aromatic cyclic hydrocarbon, the diamond-like carbon film, which contains less hydrogen, and has more $sp^3$ structures (diamond structures) and less $sp^2$ structures graphite structures), and has high hardness can be obtained even being grown under the high substrate temperature. In addition, the diamond-like carbon film contains less hydrogen, such that the quantity of the hydrogen liberated from the diamond-like carbon film under a high temperature environment can be greatly reduced, and a graphitization phenomenon of the diamond-like carbon film and the reduction of hardness of the diamond-like carbon film resulted from the graphitization of the diamond-like carbon film will not occur easily. Thus, the hardness of the diamond-like carbon film can be effectively maintained under a high temperature application environment and the diamond-like carbon film has superior temperature tolerance. Furthermore, the method of the present invention grows the diamond-like carbon film under a raised temperature process environment, such that the growing process of the diamond-like carbon film can be integrated with film-coating processes, which need to be performed under a raised temperature.

Figure 1:
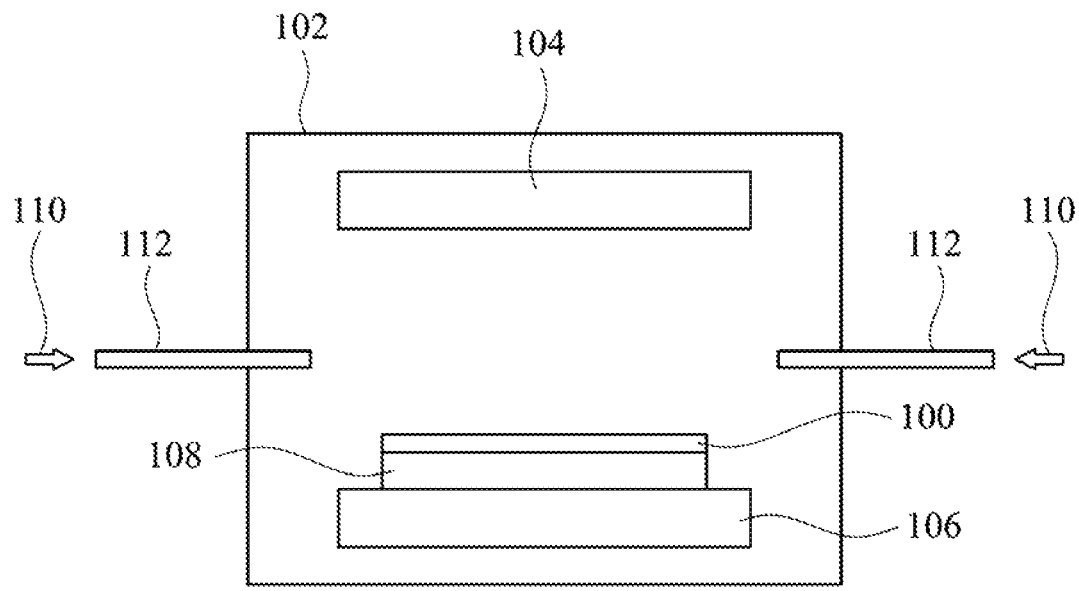
FIG. 1 is a schematic diagram of an installation for growing a diamond-like carbon film in accordance with one embodiment of the present invention.
Figure 2:
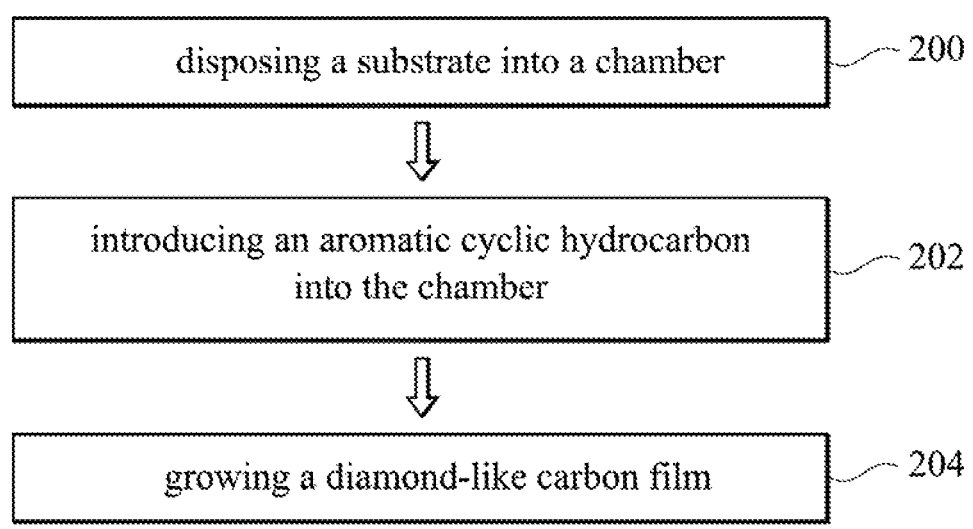
FIG. 2 is a flow chart of a method for growing a diamond-like carbon film in accordance with one embodiment of the present invention.

Referring to FIG. 1 and FIG. 2 simultaneously, FIG. 1 is a schematic diagram of an installation for growing a diamond-like carbon film in accordance with one embodiment of the present invention, and FIG. 2 is a flow chart of a method for growing a diamond-like carbon film in accordance with one embodiment of the present invention. In one embodiment of the present invention, the manufacturing of a diamond-like carbon film 100 may be performed in a chamber 102 as illustrated in FIG. 1. For example, the chamber 102 may be a plasma-enhanced chemical vapor deposition chamber, and a heater 104 and a lower electrode 106 may be disposed within the chamber 102, in which the heater 104 and the lower electrode 106 are opposite to each other.

In some examples, such as shown in FIG. 1 and FIG. 2, when the diamond-like carbon film 100 is grown within the chamber 102, a step 200 may be firstly performed to load a substrate 108 to be coated with the diamond-like carbon film 100 into the chamber 102, and to dispose the substrate 108 on the lower electrode 106. The substrate 108 may be a typical work piece, such as a component or a mold of a molding apparatus.

Then, a step 202 may be performed to introduce an aromatic cyclic hydrocarbon 110 into the chamber 102 by using a delivery pipe 112. In some examples, a chemical formula of the aromatic cyclic hydrocarbon 110 is $C_xH_y$, in which x is greater than or equal to y. In other words, in the aromatic cyclic hydrocarbon 110, the amount of the carbon elements is greater than or equal to that of the hydrogen elements. The aromatic cyclic hydrocarbon 110 may be a monocyclic aromatic hydrocarbon, such as benzene or toluene. The aromatic cyclic hydrocarbon 110 may be a polycyclic aromatic hydrocarbon. For example, the polycyclic aromatic hydrocarbon may be an aromatic cyclic hydrocarbon having a chemical formula $C_xH_y$, such as naphthalene, phenanthrene, pyrene, or fullerene, or, may be an aromatic cyclic hydrocarbon which contains not only carbon elements and hydrogen elements, but also other elements, such as phenanthroline, phenanthridine, or xanthene.

In some exemplary examples, in addition to the carbon elements and the hydrogen elements, the aromatic cyclic hydrocarbon 110 may further include nitrogen elements, oxygen elements, of sulfur elements. In such exemplary examples, with the absence of hydrogen elements of the aromatic cyclic hydrocarbon 110, a content of carbon elements of the aromatic cyclic hydrocarbon 110 in a total content of the carbon elements and the other elements (i.e. the nitrogen elements, oxygen elements, or sulfur elements) is equal to or greater than 80 atomic percent (at. %).

Optionally, before the diamond-like carbon film 100 is grown, a hydrocarbon having no benzene ring may be additionally introduced into the chamber 102. In such examples, with total parts by weight of the aromatic cyclic hydrocarbon 110 and the hydrocarbon having no benzene ring introduced into the chamber being 100, a part by weight of the hydrocarbon having no benzene ring is smaller than or equal to substantially 50. That is the aromatic cyclic hydrocarbon 110 is the main reaction precursor, and the hydrocarbon having no benzene ring is the additionally added reactant, such that the added amount of the hydrocarbon having no benzene is not over the introduced amount of the aromatic cyclic hydrocarbon 110.

After the film-coating materials including the aromatic cyclic hydrocarbon 110 are introduced into the chamber 102, a step 204 is performed to grow the diamond-like carbon film 100 on the substrate 108 by using the hydrocarbons including the aromatic cyclic hydrocarbon 110 as a reaction precursor and raising the process temperature. In some examples, the diamond-like carbon film 100 may be grown by using a typical physical vapor deposition method or a typical chemical vapor deposition method. A variation method of the typical physical vapor deposition method, such as a sputtering method; or, a variation method of the typical chemical vapor deposition method, such as a plasma-enhanced chemical vapor deposition method, a filtered cathodic arc deposition method, an electron cyclone resonance microwave plasma method, an ion plating method, or a cathodic arc deposition method, may be used.

In some examples, in the step of growing the diamond-like carbon film 100, a substrate temperature for growing the diamond-like carbon film 100 may be controlled at a range from substantially 200 degrees centigrade to substantially 800 degrees centigrade. In some certain examples, when the aromatic cyclic hydrocarbon 110 is a polycyclic aromatic hydrocarbon, such as naphthalene phenanthrene, pyrene, fullerene, phenanthroline, phenanthridine, or xanthene, the step of growing the diamond-like carbon filmy 100 may control the substrate temperature at a range from substantially 25 degrees centigrade to substantially 800 degrees centigrade, preferably at a range from substantially 100 degrees centigrade to substantially 800 degrees centigrade, and more preferably at a range from substantially 200 degrees centigrade to substantially 800 degrees centigrade.

In the growing of the diamond-like carbon film 100, the aromatic cyclic hydrocarbon 110 has the stable benzene ring structure, such that the diamond-like carbon film 100 which has more $sp^3$ structures (diamond structures) and less $sp^2$ structures (graphite structures), and has high hardness can be obtained even being grown under the high substrate temperature, thereby effectively ensuring quality of the diamond-like carbon film 100. In addition, the aromatic cyclic hydrocarbon 110 has a high carbon-hydrogen ratio, such that the diamond-like carbon film 100 has low hydrogen content. The diamond-like carbon film 100 has more $sp^3$ structures (diamond structures) and less $sp^2$ structures (graphite structures), and the low hydrogen content, such that the hydrogen liberated from the diamond-like carbon film 100 under a high temperature environment is few, and thus the diamond-like carbon film 100 can be prevented from graphitizing, thereby maintaining the hardness of the diamond-like carbon film 100 under a high temperature application environment. Accordingly, the temperature tolerance and the hardness of the diamond-like carbon film 100 can be increased. Furthermore, the diamond-like carbon film 100 is grown under the high substrate temperature, such that after other high temperature coating processes or coating processes needed to be performed under a raised temperature are completed, it takes less time to lower the process temperature to a desired growing temperature of the diamond-like carbon film 100 than the conventional normal temperature film-coating process of the diamond-like carbon film. Thus, the growing process of the diamond-like carbon film 100 can be effectively integrated with film-coating processes which need to be performed under a raised, temperature, thereby enhancing efficiency of the entire coating procedure.

Optionally, during the process of growing the diamond-like carbon film 100, silicon, boron, aluminum, titanium family (group IVB) elements, vanadium family (group VB) elements, chromium family (group VIB) elements, silicon compounds, boron compounds, aluminum compounds, compounds of titanium family (group IVB) elements, compounds of vanadium family (group VB) elements, and/or compounds of chromium family (group VIB) elements may be additionally added, so as to increase ductility of the diamond-like carbon film 100 or decrease stress of the diamond-like carbon film 100.

The following description uses three exemplary examples to illustrate that using a aromatic cyclic hydrocarbon to for a diamond-like carbon film under a high substrate temperature, such as greater than 200 degrees centigrade, can increase hardness and decrease compressive stress of the diamond-like carbon film.

In a first exemplary example, a 304 stainless steel of an appropriate size is used as a substrate sample to be coated with a diamond-like carbon film, in which a surface of the 304 stainless steel is coated with titanium metal. The substrate sample is washed by using an ultrasonic cleaning method with acetone, alcohol, and deionized water respectively to remove contaminants on the surface of the substrate sample. Next, the substrate sample is dried using nitrogen gas. Then, the substrate sample is fixed on an electrode of a vacuum chamber. Subsequently, gas within the vacuum chamber is extracted using a vacuum pump to make a pressure within the vacuum chamber be about $3\times10^{-5}$ torr. Next, argon gas and hydrogen gas are introduced into the vacuum chamber, and power is applied using a radio frequency power supply, so as to generate argon and hydrogen mixing plasma to clean the surface of the substrate sample. Now, a bias voltage of the substrate sample is controlled at a range from about 650V to about 700V, and a temperature of the substrate sample within the vacuum chamber is raised to about 500 degrees centigrade to about 600 degrees centigrade. Subsequently, toluene is introduced into the vacuum chamber, sources for providing argon gas and hydrogen gas are turned off, and the pressure within the vacuum chamber is controlled at $1.5\times10^{-2}$ torr, so as to coat a diamond-like carbon film onto the surface of the substrate sample, in which the bias voltage of the substrate sample is now controlled at about 650V. After the coating of the diamond-like carbon film is completed, a thickness of the diamond-like carbon film is measured by using an alpha-step profilometer. A stress of the diamond-like carbon film is calculated with a calculation formula. The stress of the diamond-like carbon film is about 2.91 Gpa. In addition, hardness of the diamond-like carbon film is measured by using a nanoindenter. The hardness of the diamond-like carbon film is about 37.6 Gpa.

In a second exemplary example, a one-side polished silicon wafer of 4 inches is cut to have an appropriate size, and then the cut silicon wafer is used as a substrate sample to be coated with a diamond-like carbon film. The substrate sample is firstly cleaned by using a cleaning method as that of the first exemplary example. Then, the substrate sample is fixed on an electrode of a vacuum chamber. Subsequently, gas within the vacuum chamber is extracted using a vacuum pump to make a pressure within the vacuum chamber be about $3\times10^{-5}$ torr. Next argon gas and hydrogen gas are introduced into the vacuum chamber, and power is applied using a radio frequency power supply, so as to generate argon and hydrogen mixing plasma to clean the surface of the substrate sample. Now, a bias voltage of the substrate sample is controlled at a range from about 650V to about 700V, and a temperature of the substrate sample within the vacuum chamber is raised to about 550 degrees centigrade to about 650 degrees centigrade. Subsequently, naphthalene is introduced into the vacuum chamber, sources for providing argon gas and hydrogen gas are turned off, and the pressure within the vacuum chamber is controlled at $1.5\times10^{-2}$ torr, so as to coat a diamond-like carbon film into the surface of the substrate sample, in which the bias voltage of the substrate sample is now controlled at about 700V. After the coating of the diamond-like carbon film is completed a thickness of the diamond-like carbon film is measured by using an alpha-step profilometer. A stress of the diamond-like carbon film is calculated with a calculation formula. The stress of the diamond-like carbon film is about 3.26 Gpa. In addition, hardness of the diamond-like carbon film is measured by using a nanoindenter. The hardness of the diamond-like carbon film is about 41.5 Gpa.

In a third exemplary example, a one-side polished silicon wafer of 4 inches is cut to have an appropriate size, and then the cut silicon wafer is used as a substrate sample to be coated with a diamond-like carbon film. The substrate sample is firstly cleaned by using a cleaning method as that of the first exemplary example. Then, the substrate sample is fixed, on an electrode of a vacuum chamber. Subsequently, gas within the vacuum chamber is extracted using a vacuum pump to make a pressure within the vacuum chamber be about $3\times10^{-5}$ torr. Next, argon gas and hydrogen gas are introduced into the vacuum chamber, and power is applied using a radio frequency power supply, so as to generate argon and hydrogen mixing plasma to clean the surface of the substrate sample. Now, a bias voltage of the substrate sample is controlled at a range from about 650V to about 700V, and a temperature of the substrate sample within the vacuum chamber is raised to about 200 degrees centigrade to about 250 degrees centigrade. Subsequently, benzene is introduced into the vacuum chamber, sources for providing argon gas and hydrogen gas are turned off, and the pressure within the vacuum chamber s controlled at $4.0\times10^{-2}$ torr, so as to coat a diamond-like carbon film onto the surface of the substrate sample, in which the bias voltage of the substrate sample is now controlled at about 550V. After the coating of the diamond-like carbon film is completed, a thickness of the diamond-like carbon film is measured by using an alpha-step profilometer. A stress of the diamond-like carbon film is calculated with a calculation formula. The stress of the diamond-like carbon film is about 2.6 Gpa. In addition, hardness of the diamond-like carbon film is measured by using a nanoindenter. The hardness of the diamond-like carbon film is about 32.6 Gpa.

The hardness of a conventional hydrogen-containing diamond-like carbon film is equal to or smaller than about 10 GPa to about 25 GPa, and the stress is equal to or greater than about GPa, while the hardness of a diamond-like carbon film formed by the example of the present invention can be equal to or greater than 30 GPa, even can reach 45 GPa to 50 GPa or greater, and the stress can be smaller than 4 GPa. Accordingly, the application of the examples of the present invention can increase the hardness and decrease the compressive stress of the diamond-like carbon.

According to the aforementioned embodiments of the present invention, one advantage of the present invention is that a method for manufacturing a diamond-like carbon film uses an aromatic cyclic hydrocarbon as a reaction precursor for growing a diamond-like carbon film. The aromatic cyclic hydrocarbon has a benzene ring structure, such that the diamond-like carbon film including more $sp^3$ structures (diamond structures) and less $sp^2$ structures (graphite structures) can be grown under a high substrate temperature, thereby obtaining the diamond-like carbon film of high hardness and high quality.

According to the aforementioned embodiments of the present invention, another advantage of the present invention is that in a method for manufacturing a diamond-like carbon film, an aromatic cyclic hydrocarbon used as a reaction precursor for growing a diamond-like carbon film has a high carbon-hydrogen ratio, such that a hydrogen content of the diamond-like carbon film can be effectively decreased.

According to the aforementioned embodiments of the present invention, still another advantage of the present invention is that a method for manufacturing a diamond-like carbon film can form a diamond-like carbon film with a low hydrogen content, such that the quantity of the hydrogen liberated from the diamond-like carbon film under a high temperature environment can be decreased, and a graphitization phenomenon of the diamond-like carbon film end the reduction of hardness of the diamond-like carbon film resulted from the graphitization of the diamond-like carbon film will not occur easily, thereby effectively solving a hardness reduction problem of the diamond-like carbon film occurring under a high temperature application environment.

According to the aforementioned embodiments of the present invention, further another advantage of the present invention is that a method for manufacturing a diamond-like carbon film forms a diamond-like carbon film under a high substrate temperature, such that the method can be integrated with film-coating processes which need to be performed under a raised temperature and thus, enhancing the performance of the entire film-coating processes.

Although the present invention has been described in considerable detail with reference to certain embodiments thereof, the foregoing embodiments of the present invention are illustrative of the present invention rather than limiting of the present invention. It will be apparent to those having ordinary skill in the art that various modifications and variations can be made to the present invention without departing from the scope or spirit of the invention. Therefore, the spirit and scope of the appended claims should not be limited to the description of the embodiments contained herein.

What is claimed is:

1. A method for manufacturing a diamond-like carbon film, comprising:
   disposing a substrate into a chamber;
   applying a bias voltage to the substrate;

introducing a reaction precursor into the chamber, wherein the reaction precursor is consisting of aromatic cyclic hydrocarbon; and growing a diamond-like carbon film on the substrate in the chamber when the gas environment of the chamber consists only of consist of the reaction precursor, wherein growing the diamond-like carbon film comprises controlling a substrate temperature at a range from 200 degrees centigrade to 800 degrees centigrade.

2. The method of claim 1, wherein a chemical formula of the aromatic cyclic hydrocarbon is $C_xH_y$, wherein x is greater than or equal to y.

3. The method of claim 1, wherein the aromatic cyclic hydrocarbon is a polycyclic aromatic hydrocarbon.

4. The method of claim 3, wherein the polycyclic aromatic hydrocarbon is naphthalene, phenanthrene, pyrene, fullerene, phenanthroline, phenanthridine, or xanthene.

5. The method of claim 1, wherein the aromatic cyclic hydrocarbon is a monocyclic aromatic hydrocarbon.

6. The method of claim 5, wherein the monocyclic aromatic hydrocarbon is benzene or toluene.

7. The method of claim 1, wherein the aromatic cyclic hydrocarbon comprises nitrogen elements, oxygen elements or sulfur elements, and with the absence of hydrogen elements of the aromatic cyclic hydrocarbon, a content of carbon elements of the aromatic cyclic hydrocarbon is equal to or greater than 80 at. %.

8. The method of claim 1, wherein growing the diamond-like carbon film is performed by a physical vapor deposition method, a plasma-enhanced chemical vapor deposition method, a filtered cathodic arc deposition method, an electron cyclone resonance microwave plasma method, a sputtering method, an ion plating method, or a cathodic arc deposition method.

9. A method for manufacturing a diamond-like carbon film, comprising:
disposing a substrate into a chamber;
applying a bias voltage to the substrate;
introducing a reaction precursor into the chamber, wherein the reaction precursor is consisting of aromatic cyclic hydrocarbon and a hydrocarbon having no benzene ring, and with total parts by weight of the aromatic cyclic hydrocarbon and the hydrocarbon having no benzene ring being 100, a part by weight of the hydrocarbon having no benzene ring is smaller than or equal to 50; and
growing a diamond-like carbon film on the substrate in the chamber when the gas environment of the chamber consists only of the reaction precursor, wherein growing the diamond-like carbon film comprises controlling a substrate temperature at a range from 200 degrees centigrade to 800 degrees centigrade.

10. The method of claim 9, wherein a chemical formula of the aromatic cyclic hydrocarbon is $C_xH_y$, wherein x is greater than or equal to y.

11. The method of claim 9, wherein the aromatic cyclic hydrocarbon is a polycyclic aromatic hydrocarbon, and the polycyclic aromatic hydrocarbon is naphthalene, phenanthrene, pyrene, fullerene, phenanthroline, phenanthridine, or xanthene.

12. The method of claim 9, wherein the aromatic cyclic hydrocarbon is a monocyclic aromatic hydrocarbon, and the monocyclic aromatic hydrocarbon is benzene or toluene.

13. The method of claim 9, wherein the aromatic cyclic hydrocarbon comprises nitrogen elements, oxygen elements or sulfur elements, and with the absence of hydrogen elements of the aromatic cyclic hydrocarbon, a content of carbon elements of the aromatic cyclic hydrocarbon is equal to or greater than 80 at. %.

14. The method of claim 9, wherein growing the diamond-like carbon film is performed by a physical vapor deposition method, a plasma-enhanced chemical vapor deposition method, a filtered cathodic arc deposition method, an electron cyclone resonance microwave plasma method, a sputtering method, an ion plating method, or a cathodic arc deposition method.

15. A method for manufacturing a diamond-like carbon film, comprising:
disposing a substrate into a chamber;
applying a bias voltage to the substrate;
introducing a reaction precursor into the chamber, wherein the reaction precursor is consisting of aromatic cyclic hydrocarbon, a hydrocarbon having no benzene ring, and an additive, wherein the additive is consisting of silicon, boron, aluminum, titanium family (group IVB) elements, vanadium family (group VB) elements, chromium family (group VIB) elements, silicon compounds, boron compounds, aluminum compounds, compounds of titanium family (group IVB) elements, compounds of vanadium family (group VB) elements, and/or compounds of chromium family (group VIB) elements, wherein with total parts by weight of the aromatic cyclic hydrocarbon and the hydrocarbon having no benzene ring being 100, a part by weight of the hydrocarbon having no benzene ring is smaller than or equal to 50; and
growing a diamond-like carbon film on the substrate in the chamber when the gas environment of the chamber consists only of the reaction precursor, wherein growing the diamond-like carbon film comprises controlling a substrate temperature at a range from 200 degrees centigrade to 800 degrees centigrade.

16. The method of claim 15, wherein a chemical formula of the aromatic cyclic hydrocarbon is $C_xH_y$, wherein x is greater than or equal to y.

17. The method of claim 15, wherein the aromatic cyclic hydrocarbon is a polycyclic aromatic hydrocarbon, and the polycyclic aromatic hydrocarbon is naphthalene, phenanthrene, pyrene, fullerene, phenanthroline, phenanthridine, or xanthene.

18. The method of claim 15, wherein the aromatic cyclic hydrocarbon is a monocyclic aromatic hydrocarbon, and the monocyclic aromatic hydrocarbon is benzene or toluene.

19. The method of claim 15, wherein the aromatic cyclic hydrocarbon comprises nitrogen elements, oxygen elements or sulfur elements, and with the absence of hydrogen elements of the aromatic cyclic hydrocarbon, a content of carbon elements of the aromatic cyclic hydrocarbon is equal to or greater than 80 at. %.

20. The method of claim 15, wherein growing the diamond-like carbon film is performed by a physical vapor deposition method, a plasma-enhanced chemical vapor deposition method, a filtered cathodic arc deposition method, an electron cyclone resonance microwave plasma method, a sputtering method, an ion plating method, or a cathodic arc deposition method.

* * * * *